(12) United States Patent
Maede et al.

(10) Patent No.: US 6,963,172 B2
(45) Date of Patent: Nov. 8, 2005

(54) ORGANIC EL ELEMENT DRIVE CIRCUIT AND ORGANIC EL DISPLAY DEVICE USING THE SAME DRIVE CIRCUIT

(75) Inventors: Jun Maede, Kyoto (JP); Shinichi Abe, Kyoto (JP); Akio Fujikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/684,376

(22) Filed: Oct. 15, 2003

(65) Prior Publication Data

US 2004/0080279 A1 Apr. 29, 2004

(30) Foreign Application Priority Data

Oct. 17, 2002 (JP) .................................... 2002-302824

(51) Int. Cl.[7] .............................................. G09G 3/10
(52) U.S. Cl. .............................. 315/169.1; 315/169.3; 345/76; 345/77
(58) Field of Search ...................... 315/169.1, 169.3; 345/76, 77

(56) References Cited

U.S. PATENT DOCUMENTS 6,380,689 B1 * 4/2002 Okuda ................. 315/169.3
6,756,738 B2 * 6/2004 Maede et al. ............ 315/169.1

FOREIGN PATENT DOCUMENTS

| JP | 9-232074 | 9/1997 |
|---|---|---|
| JP | 11-045071 | 2/1999 |
| JP | 2001-109430 | 4/2001 |
| JP | 2001-143867 | 5/2001 |
| JP | 2001-282168 | 10/2001 |
| JP | 2002-072947 | 3/2002 |
| JP | 2002-244618 | 8/2002 |

* cited by examiner

Primary Examiner—David Vu
(74) Attorney, Agent, or Firm—Mattingly, Stanger, Malur & Brundidge, P.C.

(57) ABSTRACT

Determination means determines for every column pin whether or not display data of a current horizontal scan period (display time period) is the same as that of a next horizontal scan line (display time period). When the display data for one horizontal line are identical, an anode of an OEL element is connected to this terminal pin and then the drive current of the OEL element having a cathode to be scanned next in the vertical direction becomes substantially the same. Then, when a next vertical line is scanned for the column pin having display data, which is determined as identical, the resetting of the OEL element is inhibited by the reset inhibit circuit and the generation of peak current in a next horizontal scan period (display time period D) is stopped.

12 Claims, 5 Drawing Sheets

ORGANIC EL ELEMENT DRIVE CIRCUIT AND ORGANIC EL DISPLAY DEVICE USING THE SAME DRIVE CIRCUIT

BACKGROUND OF THE INVENTION

1. Field of the Invention

The present invention relates to an organic EL (electroluminescence) element drive circuit and an organic EL display device using the same drive circuit and, in particular, the present invention relates to an improvement of an organic EL display device in such a way that power consumption of an organic EL display device can be reduced and an organic EL display device having the same organic EL element drive circuit.

2. Description of the Prior Art

Since an organic EL display panel is possible to realize high luminance display by spontaneous light emission, it is suitable for display on a small screen and has been paid an attention as the next generation display device to be mounted on a portable telephone set, a PHS, a DVD player or a PDA (personal digital assistance). The organic EL display device has a problem that, if a voltage drive is employed in the organic EL display device as in a liquid crystal display device, the display control becomes difficult due large variation of luminance and sensitivity difference between R (red), G (green) and B (blue) display colors. In view of this fact, an organic EL display device using a current driver has been proposed.

An organic EL display panel of an organic EL display device of a portable telephone having 396 (132×3) terminal pins for column lines and 162 terminal pins for row lines has been proposed and there is a tendency that the number of column lines and the number of row lines are further increased.

Incidentally, JPH9-232074A discloses a drive circuit for organic EL elements, in which each of the organic EL elements arranged in a matrix is driven by current and a terminal voltage of the organic EL element is reset by grounding an anode and a cathode of the organic EL element. Further, JP2001-143867A discloses a technique with which power consumption of an organic EL display device is reduced by driving organic EL elements by current with using DC-DC converters.

In an organic EL display device, one line on a column side (anode side) becomes a current discharge side and a row side (cathode scan side) becomes a current sink side. A drive current is supplied from a current drive circuit on the column side to the anodes of an organic EL element (referred to as "OEL element", hereinafter) according to a row side scan. The cathode side of the OEL element is grounded through a CMOS push-pull circuit to sink the drive current. Since the OEL element is a capacitive element, a portion of the drive current is accumulated in the OEL element as electric charge. Therefore, in the display device having a number of OEL elements arranged in matrix, charges of OEL elements surrounding the OEL element flow into the latter OEL element, causing erroneous light emission of the latter OEL element to occur.

In order to prevent such erroneous light emission, a reset period corresponding to a retrace period of a horizontal scan is provided in a display device of such kind to reset anode sides of all OEL elements in one horizontal line, which are connected to respective vertical scan lines in a row side scan (vertical scan), to a constant voltage and cathode sides of the OEL elements of a horizontal line other than those, which are not scanned, are reverse-biased.

According to a recent request of high definition display, there is a tendency that the number of drive pins is increased. Therefore, drive frequency becomes higher and power consumption tends to be increased. When the row side of any other OEL element, which is not scanned, is reverse-biased in order to prevent erroneous light emission, electric charge of the OEL element, an amount of which corresponds to the reverse-biasing is accumulated in a direction opposite to a driving direction of the OEL element. Therefore, when the OEL element is to be scanned, transient current, which is large enough to drive the other OEL elements while canceling out the electric charge accumulated therein, flows. As a result, the increase of drive current by power consumption due to current for accumulating the electric charge corresponding to the reverse-biasing and the transient current become not negligible.

SUMMARY OF THE INVENTION

An object of the present invention is to provide an organic EL element drive circuit, with which power consumption of an organic EL display device can be reduced.

Another object of the present invention is to provide an organic EL display device in which power consumption can be reduced.

In order to achieve the above objects, an organic EL element drive circuit for current-driving organic EL elements in a manner that a display period corresponding to a horizontal scan period and a reset period corresponding to a retrace period of the horizontal scan are provided and the organic EL elements are current-driven through terminal pins in the display period and terminal voltages of the organic EL elements are reset in the reset period, is featured by comprising:

switch circuits for resetting the organic EL elements by setting anode sides of the organic EL elements to a predetermined potential through the terminal pins in the reset period;

peak current generator circuits for generating peak currents superposed on the drive currents of the organic EL elements;

a reset inhibit circuit for inhibiting the resetting by the switch circuits and stopping the generation of peak currents by the peak current generator circuits; and determination means for determining whether the drive current through the terminal pin in a display period in a current horizontal scan is substantially the same as that in the display period of a next horizontal scan, the reset inhibit circuit being actuated to inhibit the resetting and stop the generation of the peak current when the determination means determines that the drive current in the display period of the current horizontal scan is substantially the same as that of the next horizontal line.

Incidentally, the resetting of the terminal pins of the OEL elements to the constant voltage is performed by precharging the terminal pins to the predetermined constant voltage. Therefore, a waveform of a drive current for driving the organic EL element, which is supplied to each column pin of the organic EL element drive circuit, has a peak current starting from the predetermined constant current as shown by a solid curve in FIG. 3(g). Incidentally, a dotted curve in FIG. 3(g) shows a voltage waveform.

This resetting to the constant voltage is performed in a reset period RT corresponding to the retrace period of the horizontal scan and the display period D corresponds to one line horizontal scan period. The partitioning of the display period D from the reset period RT is performed by the reset control pulse (timing control pulse), which has a period corresponding to (D+RT). Incidentally, FIG. 3 shows the waveforms of dive currents supplied to the respective terminal pins and the timing signal for generating these drive currents.

Describing FIG. 3 in detail, FIG. 3(a) shows a sync clock CLK forming a base of the timing of control signals and FIG. 3(b) shows a count start pulse CSTP of a pixel counter, count value of which is shown in FIG. 3(c). FIG. 3(d) shows a display start pulse DSTP and FIG. 3(e), FIG. 3(f) and FIG. 3(h) show the reset control pulses RS, a peak generation pulse Pp and a row side scan line switching pulse RCLK for switching the scan from a certain row line to a next row line (vertical scan), respectively.

Incidentally, the sync clock CLK, the count start pulse CSTP, the display start pulse DSTP, the reset control pulse RS, the peak generation pulse Pp and the line switching pulse RCLK, etc., are generated by a control circuit (see a control circuit 23 shown in FIG. 1) having a timing pulse generator circuit.

In the present invention, the determination means determines for each of column pins (terminal pins) whether or not display data of a current horizontal scan period (display period) is identical to display data of a next horizontal scan period. When display data of column pins in one horizontal line are identical, drive currents of OEL elements having anodes connected to the column pins and cathodes to be scanned by a next vertical scan become identical. Therefore, according to the present invention, when one of column pins having identical display data is to be scanned by a next vertical scan, the resetting of the OEL element is inhibited by the reset inhibit circuit and the generation of peak current in a horizontal scan period (display period D) next to the reset period is stopped.

Therefore, when a cathode of an OEL element having an anode connected to a column pin, the resetting of which is inhibited by the vertical scan by the row side scan circuit, is to be scanned, the OEL element is precharged by supplying electric charge of an anode of an immediately preceding OEL element, which is connected to the same column pin and whose scan by the row side scan circuit is over, to an anode of the OEL element, which is connected to the same column pin to be scanned next.

In this case, since there is some residual electric charge on the OEL element, which is not reset, the precharging voltage for the OEL element is close to a terminal voltage of the OEL element driven immediately before, at a stop time of light emission. Therefore, the OEL element connected to the same column pin whose resetting is inhibited is precharged by the residual charge of the OEL element, which is driven immediately before, and a current, which is substantially the same as the drive current of the column pin in the immediately preceding row side scan, flows through the OEL element. Therefore, luminance of the OEL element for the column pin whose resetting is inhibited in the horizontal scan period (display period D) becomes substantially constant.

As a result, the power consumed by the resetting and the power for generating the peak current of the OEL element connected to the column pin whose resetting is inhibited are restricted, so that it is possible to reduce the power consumption of the whole organic EL display device.

In another aspect of the present invention, the display data identification of not the display data for each column pin but the whole display data for one horizontal line is determined for each of the three primary colors.

That is, according to another aspect of the present invention, a whole display data for each of the three primary colors in a next horizontal scan line is read and is compared with a whole display data of a current horizontal line. Then, it is determined for each of the primary colors whether or not the display data of the next horizontal scan line is identical to that of the current horizontal scan line and, when the data of the both horizontal scan lines are identical for each primary color, the resetting of the column pin for the horizontal scan line in the reset period are inhibited and the generation of peak current for the horizontal lines is stopped. Thus, the power consumption can be restricted.

BRIEF DESRIPTION OF THE DRAWINGS

DETAILED DESCRIPTION OF THE PREFERRED EMBODIMENTS

Figure 1:
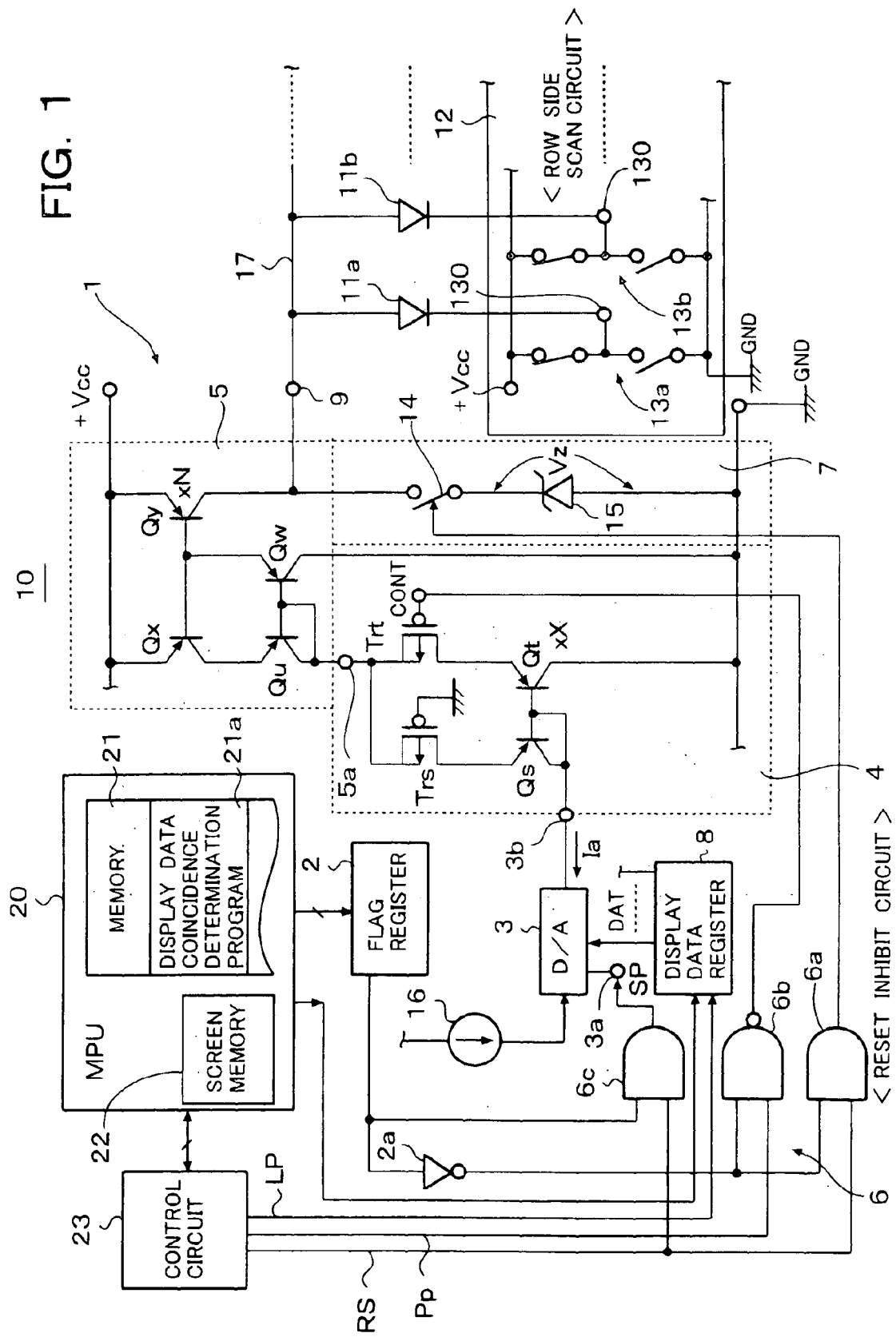
FIG. 1 is a block circuit diagram of a current drive circuit, which is provided for every terminal pin of a column driver of an organic EL display panel, according to an embodiment of the present invention.

In FIG. 1, a column driver IC 10 as an organic EL element drive circuit of an organic EL display panel includes current drive circuits 1 provided for respective, column pins of the display panel.

The current drive circuit 1 includes a flag register 2, a D/A converter circuit 3, a peak current generator circuit 4, an output stage current source 5, a reset inhibit circuit 6, a reset circuit 7 and a display data register 8.

Incidentally, the flag resistor 2 is provided for not every column pin. That is, the flag register 2 is provided in the column driver 10 and one of flag data bits stored in the flag register 2 corresponds to different one of the current drive circuits 1. Therefore, the flag data bits are provided correspondingly to the column pins, respectively.

The column driver 10 further includes an MPU 20 for controlling an operation of the column driver 10, a memory 21, a screen memory 22 and a control circuit 23. The control circuit 23 generates timing pulses such as a reset control pulse RS and a peak generation pulse Pp under control of the MPU 20.

The MPU 20 determines for every column pin whether or not display data in a current display period is identical to that in a next display period and a 1-bit flag data, which is "1" when the display data in the current and the next display periods are identical and "0" when the display data are different, is set in a position of the flag register 2, which corresponds to that column pin.

A display data coincidence determination program 21a is stored in the memory 21 as a processing program therefor.

The screen memory 22 for storing display data of a whole screen, which is to be displayed at present is included in the MPU 20. The MPU 20 executes the display data coincidence determination program 21a by reading out display data of all column pins in one horizontal line corresponding to the next vertical scan line (row side line) from the screen memory 22, comparing the display data thus read out with the display data of all column pins in one horizontal line corresponding to the current vertical scan line and determining for every column pin whether or not the current display data is identical to the next display data. The flag data thus obtained is set in the flag register 2.

Incidentally, as mentioned previously, the data bit of the flag data for every column pin is "1" when the display data of the current and next, are identical, otherwise "0".

Figure 3:
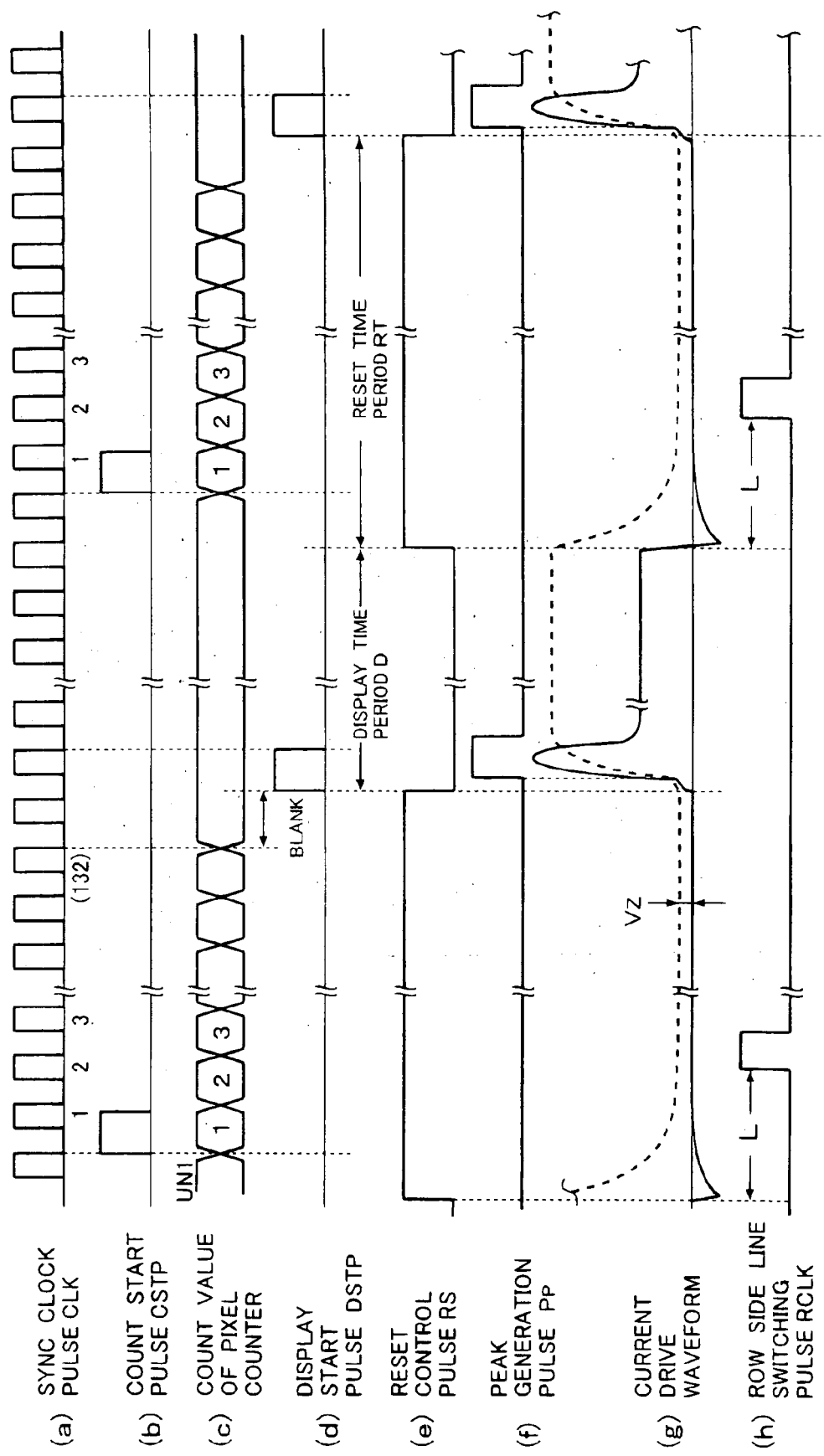
FIG. 3 shows waveforms of current for driving terminal pins and a timing signal for generating the waveforms.

The timing of the flag data setting is synchronized with a falling edge of the peak generation pulse Pp (see FIG. 3(f)) from the control circuit 23. However, this flag data may be set at any time within a period from the falling edge of the peak generation pulse Pp to a rising edge of the reset control pulse RS.

The display data for one horizontal line corresponding to the next vertical (row side) scan line, which is read out from the screen memory 22, is held until the scan timing of the next vertical scan line and becomes a display data for the current one horizontal line at a time of the next scan timing. This display data is set in the display data register 8 correspondingly to the respective column pins in the next reset time period. Therefore, the reading of the display data in such horizontal line is performed by preliminarily reading once the next horizontal line corresponding to the vertical line scan.

In this case, in order to perform the comparison of display data in an initial state in which the power source is turned ON, the display data in the current horizontal line and in the next horizontal line are read out. However, the reading of the display data in the initial stage is not always necessary. That is, if the display data for the next horizontal line on the screen succeeds the display data for the current horizontal line, the comparison can be done by circulating the reading for the next horizontal scan line endlessly.

A constant current source 16 is provided for every column pin and supplies a reference drive current to the D/A converter circuit 3. The constant current source 16 may be constructed with a current mirror circuit having an input side transistor and a plurality (n) of output side transistors and generates copies of the reference drive current by the output side transistors. The copied currents are supplied to the respective column pins.

The peak current generator circuit 4 includes a PNP type input side transistor Qs and a PNP type output side transistor Qt, which is diode-connected to the transistor Qs. Emitters of the transistors Qs and Qt are connected to an input terminal 5a of the output stage current source 5 through a P channel MOSFET Trs and a P channel MOSFET Trt, respectively.

A collector of the transistor Qs is connected to an output terminal 3b of the D/A converter circuit 3 and a collector of the transistor Qt is grounded. An emitter area ratio of the transistor Qs and the transistor Qt is 1:x.

Assuming that the output current of the D/A converter circuit 3 is Ia, the peak current generator circuit 4 generates a drive current $(x+1) \times Ia$ at the input terminal 5a when the transistor Trt is in ON state. The transistor Trs is a load transistor provided correspondingly to the transistor Trt and has a gate grounded. The transistor Trs is inserted for balancing the drive lines. Incidentally, the transistor Trt receives the peak current and generates the peak generation pulse Pp shown in FIG. 3(f) at its terminal CONT through the reset inhibit circuit 6 in a constant period in an initial drive stage. The transistor Trt is in ON state for a "H" period of the peak generation pulse Pp.

The peak current generator circuit 4 drives a PNP type input side transistor Qx of the output stage current source 5 through the input terminal 5a and PNP type current mirror transistors Qu and Qw for base current correction.

As a result, the drive current $(1+x) \times Ia$ flows through the input side transistor Qx for a constant ON period of the transistor Trt and then the drive current Ia flows in the transistor Qx as a usual drive current. The drive current having the above mentioned waveform is multiplied by N by the PNP type output transistor Qy of the output stage current source 5 and outputted to the output pin 9 (column pin) of the organic EL display panel.

The output pins 9 are recently pads provided on not a flexible substrate but an IC chip and are integrally connected to the respective column pins of the organic. EL display panel through gold bumps, gold balls, solder bumps or solder balls. Therefore, as shown in FIG. 1, the output pins 9 correspond to the respective column pins of the organic EL display panel and become integral therewith when these output pins are connected to the column pins. The circuits provided for each output pin 9 are those provided correspondingly to the respective column pins. Therefore, in this description, it should be noted that the term "output pin" is analogous to the term "column pin".

An emitter area ratio of the transistors Qx and Qy of the output stage current source 5 is 1:N and the emitters of these transistors are connected to a power source line +Vcc, which is in a range, for example, from +15V to +20V. A collector of the output side transistor Qy is connected to the output pin 9, which is connected to an anode of one of the OEL elements 11a, 11b, . . . , arranged in the row direction (vertical direction) through an anode side connecting line 17 or a column side wiring line 17 (the present invention will be described with using the anode side connecting line 17, hereinafter). Incidentally, the anode side connecting line 17 is provided for every column pin and, for example, 132 anode side connecting lines 17 are provided for every column driver 10, so that totally 396 anode side connecting lines 17 are provided for one horizontal scan line.

In the horizontal scan period (display time period), the current drive circuit 1 outputs the drive current $N \times (1+x) \times Ia$ and the drive current $N \times Ia$ to the output pin 9 as the peak current and the usual current, respectively. Therefore, the OEL element 11 as one of the OEL elements 11a, 11b, . . . , which have the capacitive load characteristics, is initially charged by the peak current and then driven by the usual drive current.

Further, the output pin 9 is grounded through the reset circuit 7. The reset circuit 7 is constructed with a discharge switch circuit 14 and a Zener diode 15 connected in series with the discharge switch circuit 14. One end of the discharge switch circuit 14 is connected to the output pin 9 and one end of the Zener diode 15 is grounded.

The discharge switch circuit 14 is in ON state during the reset time period of the reset control pulse RS (FIG. 3(e)) from the reset inhibit circuit 6. Therefore, the anode side of the OEL element 11 is reset (precharged) to a constant voltage Vz, which is set by the Zener diode 15 as the constant voltage circuit, during a period during which the reset control pulse RS is in "H" level.

The cathode of the OEL element 11 connected to the anode side connecting line 17 is connected to an input/output terminal 130 of the push-pull switch circuit 13, which is any one of the switch circuits 13a, 13b, . . . . The OEL element 11 is grounded or connected to a power source line +Vcc through the switch circuit 13, selectively.

Incidentally, although only one output pin 9 is shown in FIG. 1, there are output pins 9 for one horizontal scan line. The cathode sides of the OEL elements 11a, 11b, . . . , for the one horizontal line, which are connected to the respective output pins 9, are connected to the input/output terminal 130 commonly. The vertical line scan is performed by grounding these cathodes of the OEL elements in one horizontal line.

The reset inhibit circuit 6 is constructed with two 2-input AND circuits 6a and 6c and a 2-input NAND circuit 6b. The reset inhibit circuit 6 outputs a signal of "1" (or "H") in response to the 1-bit flag data from the flag register 2, the reset pulse RS from the control circuit. 23 and the peak generation pulse Pp, which are "0" (or "L") or "1" (or "H"). Under this reset inhibit condition, the reset inhibit circuit 6 inhibits generation of the reset control pulse RS by means of the inverter 2a and the AND circuit 6a thereof. Further, the NAND circuit 6b of the reset inhibit circuit 6 blocks the generation of the peak current in the display period D (FIG. 3(e)). In addition, the AND circuit 6c terminates the current output operation of the output stage current source 5 in the reset period RT (FIG. 3(e)).

Incidentally, when the current output operation of the output stage current source 5 is stopped, an output impedance of the output pin 9 becomes high. Further, when the peak current generation is stopped, the OEL element 11 is driven without precharge by the peak current in a horizontal scan period (display period D) next to the reset period and, therefore, the drive current becomes substantially the same as the drive current of an immediately preceding horizontal scan line (display period D).

Besides, the switching from the current vertical scan line to the next vertical scan line is performed in a midway of the reset period RT as shown in FIG. 3(h). At a start time of the reset period RT, all vertical scan lines are temporarily grounded by the row side scan circuit 12. Only the next vertical scan line, which is to be scanned at the switching time point, is kept grounded and the remaining vertical scan lines are maintained at, for example, "H" level, so that the above mentioned switching is ended. When the reset period RT is terminated, the discharge switching circuits 14 corresponding to the column pins in one horizontal line are turned OFF, providing the display period D.

Besides, the AND circuit 6a has one input supplied with, as a gate signal, the 1-bit data from the flag register 2 through the inverter 2a. When the gate signal is "0", the output of the inverter 2a becomes "H". Therefore, the reset control pulse RS (FIG. 3(e)) inputted to the other input of the AND circuit 6a is supplied to the discharge switch circuit 14 to turn it ON for the time in which the reset control pulse RS is "H" to thereby reset (precharge) the terminal voltage of the OEL element 11 to the constant voltage Vz (=Zener voltage of the Zener diode 15). Since the reset control pulse RS is "L" (FIG. 3(e)) outside of this period, the output of the AND circuit 6a is "L" and the discharge switch circuit 14 is turned OFF.

On the other hand, when the 1-bit data is "1", the AND condition of the AND circuit 6a is not established since the output of the inverter 2a is "L". Therefore, the output of the AND circuit 6a is kept at "L", so that the reset control pulse RS is blocked by the same AND circuit.

An input of the NAND circuit 6b is supplied with a 1-bit data as a gate signal from the flag register 2 through the inverter 2a. When the 1-bit data is "0", the NAND circuit 6b inverts the peak generation pulse Pp (FIG. 3(f)) inputted to the other input thereof and generates an "L" ("L" is significant) to the terminal CONT during the "H" period of the peak generation pulse Pp, to turn the P channel transistor Trt ON to thereby drive the OEL element 11 with the peak current. Since there is no peak generation pulse generated outside of this "H" period, the output of the NAND circuit 6b is "H" and the transistor Trt is in OFF state. On the other hand, when the 1-bit data is "1", the output of the inverter 2a is "L" and the other input of the NAND circuit 6b is "L". Therefore, the output of the NAND circuit 6b becomes "H". Consequently, the peak generation pulse Pp is blocked by the NAND circuit 6b and the output thereof does not become "L". Thus, the transistor Trt is OFF during the display time period. The drive current generated at the output pin 9 in this case is the usual drive current (N×Ia).

One input of the AND circuit 6c is supplied with the 1-bit data directly from the flag register 2 as a gate signal and the other input thereof is supplied with the reset control pulse RS (FIG. 3(e)). When the 1-bit data is "0", the output of the AND circuit 6c is always L", which is supplied to the D/A converter circuit 3 through the input terminal 3a. The signal "L" is invalid signal for the operation of the D/A converter circuit 3.

On the other hand, when the 1-bit data from the flag register 2 is "1", and the reset control pulse RS (FIG. 3(e)) becomes "H", that is, when the operation enters into the reset period, a stop signal SP ("H") for stopping the operation of the D/A converter circuit 3 is outputted to one input of the AND circuit 6c. In response to the stop signal SP ("H") supplied to the input terminal 3, the D/A converter circuit 3 stops its operation, so that the output thereof becomes "0". As a result, the operation of the output stage current source 5 is stopped.

Therefore, the output impedance of the output pin 9 becomes high during the reset period RT.

As a result, the resetting is inhibited by the reset inhibit circuit 6. When the output pin 9 is not reset, that is, when the 1-bit data from the flag register 2 is "1", a predetermined voltage corresponding to the drive current in the display period D immediately before the reset period remains in the anode of the OEL element 11 and charge corresponding to this residual voltage is accumulated in the OEL element 11. Therefore, when the driving of row side scan is switched to the OEL element 11 of the next scan line, the charge of the anode of the OEL element 11 of the former scan line is supplied to the anode of the OEL element 11 of the later scan line. Since, in this case, the output impedance of the output pin 9 is high, there is substantially no flow of charge to the output pin 9.

In this case, the drive current of the output pin 9 is the same as that in the immediately preceding vertical scan line. In addition, luminance of the OEL element 11, which is connected to this output pin 9, does not change substantially since the initial charging due to electric charge from the immediately preceding OEL element 11 is performed in the reset period.

Incidentally, the charge is transferred instantaneously from the OEL element 11 belonging to the line for which the row side scan is over to the anode of the OEL element 11 belonging to the line for which a next row side scan is to be performed, even when the cathode of the OEL element 11 belonging to a line for which the row side scan is over is pulled up to "H" by one of the switch circuits 13a, 13b, . . . .

Therefore, even in such case, it is possible to transfer the electric charges from the OEL element 11 belonging to the line for which the scan is over. In the present invention, it is enough that, in the row side scan, some charge is supplied from a preceding OEL element 11 to an immediately succeeding OEL element 11 to initially charge the latter OEL element 11. With such initial charging, luminance variation of the latter OEL element 11 becomes inconspicuous when the latter OEL element 11 is driven with the same current value.

Figure 2:
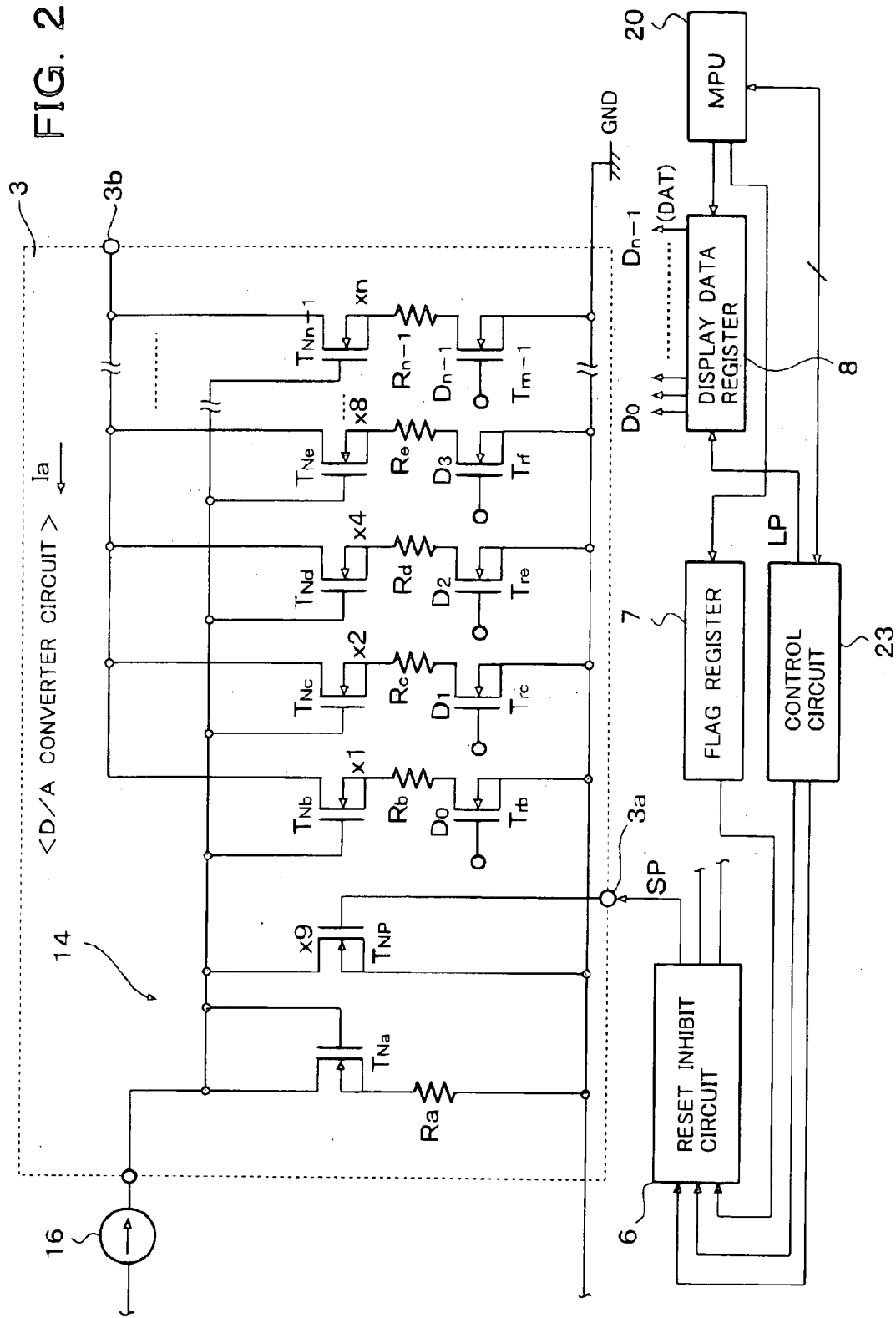
FIG. 2 is a circuit diagram of an operation stopping circuit of a D/A converter circuit shown in FIG. 1.

FIG. 2 is a circuit diagram of the D/A converter circuit 3 for stopping its D/A converting operation according to "H" output of the AND circuit 6c.

The D/A converter circuit 3 is constructed with a current mirror circuit including an input side N channel transistor TNa supplied with the reference drive current from the constant current source 16 and functions to multiply the reference drive current with the display data.

In detail, in addition to the N channel transistor TNa, the current mirror circuit constituting the D/A converter circuit 3 includes output side N channel transistors TNb to TNn-1 and an N channel MOS transistor TNp provided between a gate of the input side transistor TNa and ground GND. The display data are supplied to terminals Do to Dn-1. A gate of the transistor TNp is connected to the input terminal 3a.

Incidentally, resistors Ra to Rn-1 provided on downstream sides of the output side transistors TNb to TNn-1 function to balance operating currents of the current mirror circuit and N channel transistors Trb to Trn-1 provided on downstream sides of the respective resistors Ra to Rn-1 are switching transistors, which are ON/OFF controlled by the display data.

In the reset inhibit state, a gate of the transistor TNp receives the stop signal SP ("H") from the AND circuit 6c through the input terminal 3a. In this case, the transistor TNp is turned ON and the transistors TNa and TNb to TNn-1 are turned OFF, so that the operation of the D/A converter circuit 3 is stopped. At this time, the current at the output terminal 3b of the D/A converter circuit 3 becomes "0", so that there is no conversion current corresponding to the display data.

On the other hand, in response to an "L" signal supplied from the AND circuit 6c, the gate of the transistor TNp is turned OFF, so that the transistors TNa and TNb to TNn-1 operate as the current mirror circuit and the D/A converter circuit 3 performs the D/A conversion correspondingly to the display data.

Figure 4:
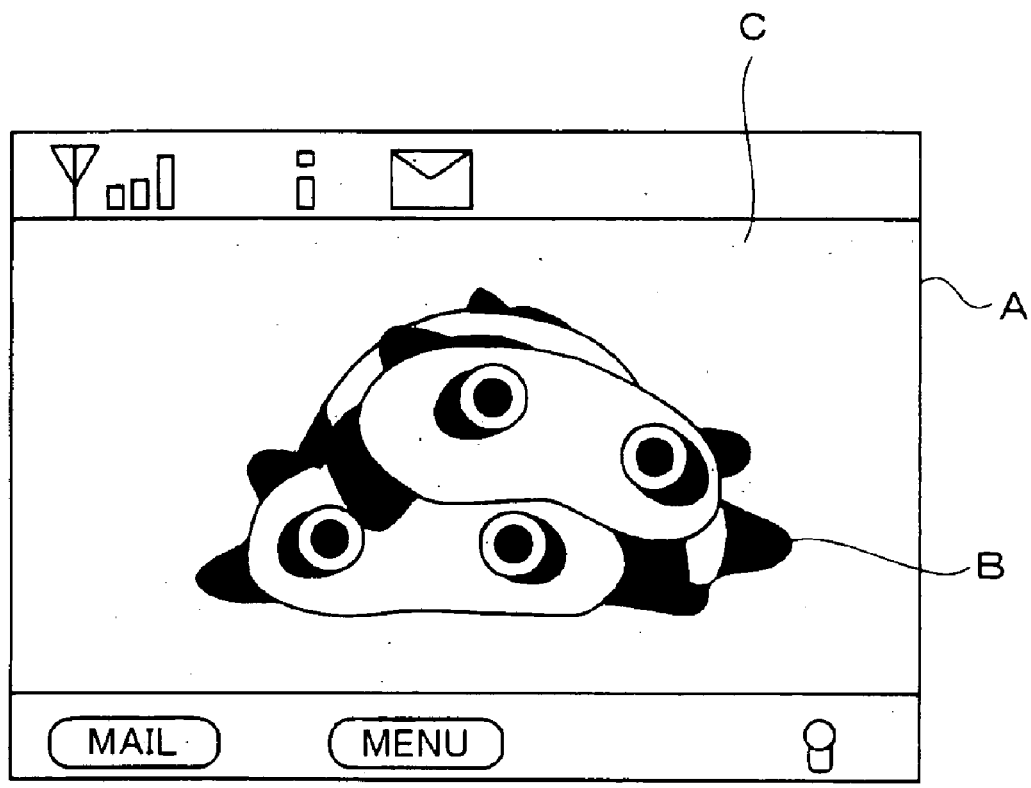
FIG. 4 shows an example of a display image.

FIG. 4 shows an example of a display image A to be displayed on the display screen. In FIG. 4, the display image A includes an image B and a background C thereof. When a display area of the background C is monochromatic or any one of the primary colors, the column pins corresponding to a current and succeeding horizontal scan lines have identical luminance. In such case, in the column driver 10 of the present invention in which the reset inhibit control is performed by the reset inhibit circuit 6 in the current drive circuit 1, the image display is performed with the same luminance by driving the output pins by the same drive currents without resetting the OEL elements corresponding to the background and without generating the peak current. Therefore, the power consumption of the OEL display device due to the display area of the background C in which the OEL elements can not reset and there is no peak current generated.

Figure 5:
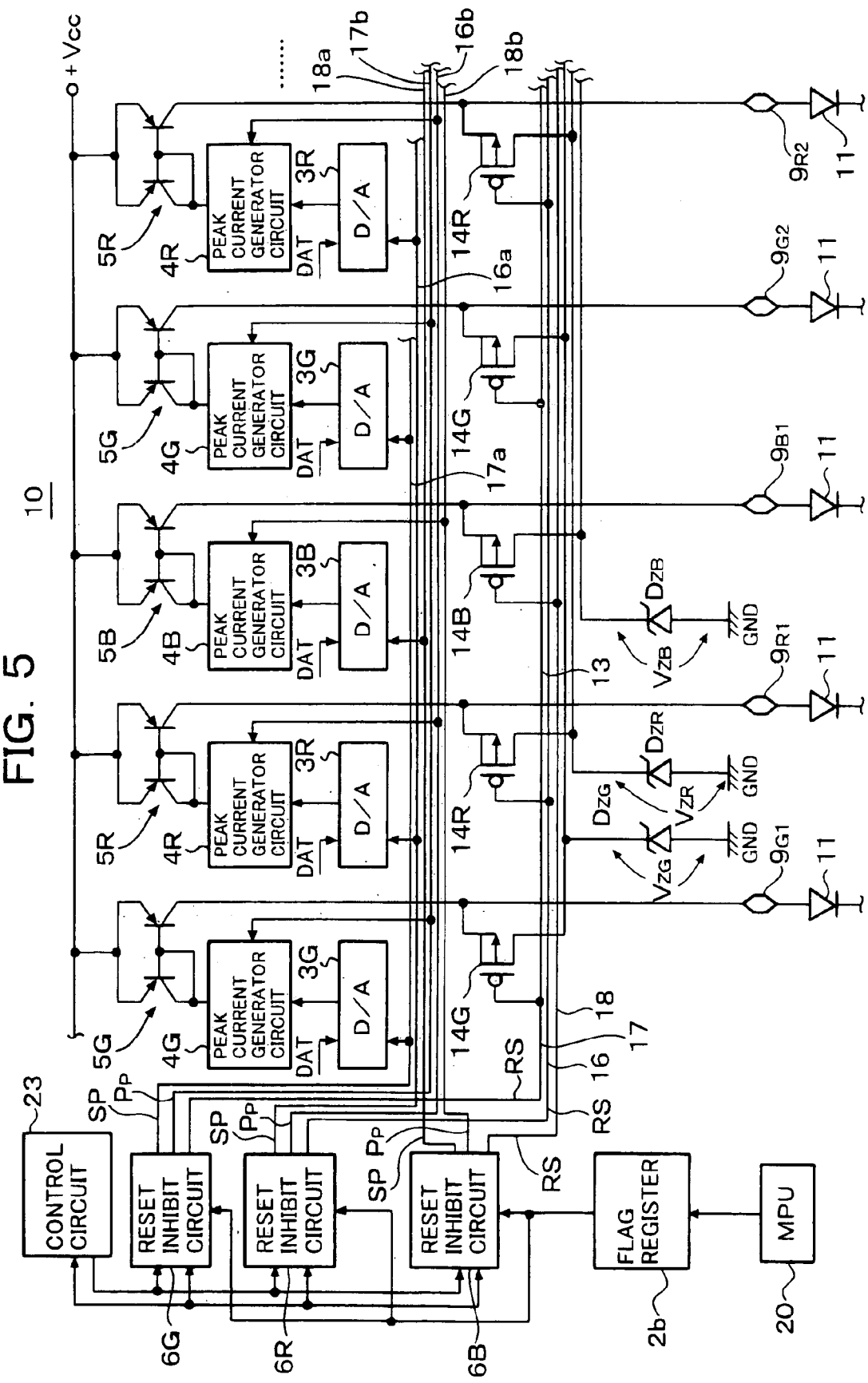
FIG. 5 is a bock circuit diagram of a current drive circuit for inhibiting resetting of one horizontal line according to display data of one horizontal line for each of the R, G and B display colors.

In the above described embodiment, the reset inhibition of the OEL element is performed for each column pin. FIG. 5 shows another embodiment in which the column pins for one horizontal line are inhibited simultaneously correspondingly to the display data of the horizontal line for R, G and B display colors.

Incidentally, the display data for one horizontal line covers a plurality of, for example, three column drive ICs at present. Since, in the embodiment shown in FIG. 1, the identification of display data for every terminal pin is determined, it is possible to provide the reset inhibit circuit 6 and the flag register 2 within the column driver 10. In the embodiment shown in FIG. 5, it is preferable that the reset inhibit circuit 6 and the flag register 2 are provided as individual circuit outside the column driver 10 since the data covers a plurality of ICs. For example, these circuits may be provided within, for example, the control circuit 23.

In FIG. 5, discharge switch circuits for the three primary colors for one horizontal line are constructed with PMOS transistors 14R, 14G and 14B provided correspondingly to the output pins 9 for the R, G and B display colors, respectively. Sources of these PMOS transistors are connected to the respective output pins 9 and drains thereof are grounded through a Zener diode DZR, which is commonly used by the PMOS transistors 14R, a Zener diode DRG, which is commonly used by the PMOS transistors 14G and a Zener diode DZB, which is used commonly by, the PMOS transistors 14B, respectively.

Incidentally, the Zener diodes DZR, DZG and DZB correspond to the Zener diode 15 in FIG. 1 and, therefore, the Zener diodes DZR, DZG and DZB may be replaced by the Zener diode 15.

In FIG. 5, each of terminal pins 9G1, 9R1 and 9B1, 9G2, 9R2, 9B2, ..., corresponds to the output pin 9 in FIG. 1.

Gates of the discharge switch circuits 14R, 14G and 14B receive reset inhibit pulses RS from the reset inhibit circuits 6R, 6G and 6B, which are provided correspondingly to the R, G and B display colors, through drive lines 16, 17 and 18, which are also provided correspondingly to the R, G and B display colors, respectively.

Input terminals 3a of D/A converter circuits 3R, 3G and 3B, which are for respective horizontal lines, are connected to the drive lines 16a, 17a and 18a and receive the stop signals SP from the reset inhibit circuits 6R, 6G and 6B, respectively. The terminals CONT of the peak current generator circuits 4R, 4G and 4B are connected to the drive lines 16b, 17b and 18b, respectively, and receive the peak generation pulses Pp from the reset inhibit circuits 6R, 6G and 6B through these drive lines, respectively.

Each of the reset inhibit circuits 6R, 6G and 6B corresponds to the reset inhibit circuit 6 shown in FIG. 1. Although not shown in FIG. 5, the reset control pulse RS is outputted from the AND circuit 6a of each reset inhibit circuit. The NAND circuit 6b outputs signal "L" obtained by inverting the "H" peak generation pulse Pp when the reset inhibit is invalid and the NAND circuit 6b outputs the signal "H" when the reset inhibit is valid and the AND circuit 6c outputs the stop signal SP.

Each of the D/A converter circuits 3R, 3G and 3B corresponds to the D/A converter circuit 3 shown in FIG. 1 and each of the peak current generator circuits 4R, 4G and 4b corresponds to the peak current generator circuit 4 shown in FIG. 1.

The flag register 2b corresponds to the flag register 2 shown in FIG. 1.

The MPU 20 executes the display data coincidence determination program 21a by reading display data for one horizontal line corresponding to the next vertical scan line (row side line) for each of the R, G and B display colors from the screen memory 22, comparing the display data thus read out with the display data for one horizontal line corresponding to the current vertical scan line and determining whether or not the current display data is identical to the next display data. The 3-bit flag data thus obtained is set in the flag register 2b.

Therefore, when same luminance (same drive current) of one horizontal line as that of a horizontal line immediately preceding the one line continues for each of the R, G and B display colors in the vertical line scan, the resetting of the preceding line is inhibited to block the generation of peak current. As a result, the resetting of the OEL element is inhibited and the generation of peak current is blocked in the background portion of the image a shown in FIG. 4 and the display region B in which luminance of two or more horizontal lines is the same. Therefore, it is possible to reduce power consumption of the EL display device by the present drive circuit.

As described hereinbefore, according to this embodiment, the output impedance of the output pin 9 is kept high during the reset time period when the resetting of the output pin 9 is inhibited. In order to realize this, the operation of the D/A converter circuit is stopped during the reset period to thereby block the generation of output current. However, the method for keeping the output impedance high is not limited to the stoppage of operation of the D/A converter circuit. For example, when a current discharging current source is connected to the output pin 9, the output impedance of the output pin 9 can be kept high by stopping the operation of the current source.

Incidentally, it may be possible to flow the drive current continuously from the current source during the current horizontal scan period (display period) by operating the output current source continuously during the reset period, without keeping the output impedance of the output pin 9 high. In this case, since, even when the display data for the next horizontal scan is set in the D/A converter circuit 3 during the reset period, the same display data is set in the reset period. Therefore, no substantial noise hardly appears on the display screen.

Further, in the embodiment of the present invention, the constant voltage resetting is performed by precharging the anode of the OEL element connected to the output pin 9 to a constant voltage. However, it can be realized by grounding the anode of the OEL element or by precharging it after the grounding. In other words, the resetting method is any, provided that the anode of the OEL element is set to a predetermined potential.

Further, in the described embodiment, the determination of display data identification is performed by executing the determination program by the MPU. However, it is of course possible that the determination may be performed by providing a comparator and a hard circuit such as register for storing the display data.

What is claimed is:

1. An organic EL element drive circuit for current-driving organic EL elements in a manner that a display period corresponding to a horizontal scan period and a reset period corresponding to a retrace period of a horizontal scan line are provided and said organic EL elements are current-driven through terminal pins in the display period and terminal voltages of said organic EL elements are reset in the reset period, said organic EL element drive circuit comprising:

switch circuits for resetting said organic EL elements by setting anode sides of said organic EL elements to a predetermined potential through said terminal pins in the reset period;

peak current generator circuits for generating peak currents superposed on the drive currents of said organic EL elements;

a reset inhibit circuit for inhibiting a resetting by said switch circuits and stopping generation of the peak currents by said peak current generator circuits; and determination means for determining whether the drive current for the current display period is substantially the same as that in the display period of a next horizontal scan line, said reset inhibit circuit being actuated to inhibit the resetting and stopping the generation of the peak current when said determination means determines that the drive current for the display period of a current display period is substantially the same as that of a next horizontal scan line.

2. An organic EL element drive circuit as claimed in claim 1, further comprising a scan circuit for setting a cathode of said organic EL element to be scanned in vertical direction to a predetermined reference potential and pulling up a cathode of said organic EL element whose scan is over, to the predetermined reference potential or higher, wherein said horizontal scanline is sequentially selected as a vertical scan line by said circuit.

3. An organic EL element drive circuit as claimed in claim 2, wherein said determination means determines for each of the terminal pins whether the drive current for the current display period is substantially the same as that in the display period of a next horizontal scan line and said reset inhibit circuit is actuated to inhibit the resetting of the OEL element connected to the terminal pin of which the drive current is substantially the same as that of a next horizontal scan line.

4. An organic EL element drive circuit as claimed in claim 3, wherein said terminal pins are provided correspondingly to respective said horizontal scan lines, a plurality of current sources having output pins connected to respective said terminal pins, the predetermined reference potential is ground potential, each of said switch circuits is provided between said output pins and a line of the predetermined potential and performs the resetting in response to a timing control signal for separating the display period from the retrace period, said reset inhibit circuit inhibits the resetting by blocking the timing control signal supplied to said switch circuit.

5. An organic EL element drive circuit as claimed in claim 4, wherein said reset inhibit circuit stops an operation of said current source corresponding to said terminal pin when the resetting of a certain one of said terminal pins, to make an output impedance of said output pin high.

6. An organic EL element drive circuit as claimed in claim 5, further comprising a D/A converter circuit for generating a current for driving said current source by D/A-converting display data, wherein the stoppage of operation of said current source is performed by stopping the operation of said D/A converter circuit.

7. An organic EL element drive circuit as claimed in claim 6, wherein said judge means compares the display data of respective said terminal pins in the current display period with the display data of the display period of the next horizontal scan line.

8. An organic EL element drive circuit as claimed in claim 7, further comprising a register, wherein said judge means sets a result of judgement in said register as 1-bit data, said reset inhibit circuit includes a first and second logic circuits supplied with the timing control signal, said first logic circuit generates a logic signal for inhibiting the resetting in response to the 1-bit data set in said register and said second logic circuit generates a logic signal for stopping the generation of peak current.

9. An organic EL element drive circuit as claimed in claim 7, wherein said line having the predetermined potential is a constant voltage line provided commonly for said output pins for one horizontal scan line and said judge means compares the display data for one horizontal scan line.

10. An organic EL element drive circuit as claimed in claim 9, wherein said organic EL element is provided for each of R, G and B display colors, said constant voltage line is provided commonly for said output pins of a horizontal scan line of each of R, G and B display colors.

11. An organic EL element drive circuit as claimed in claim 10, wherein each of said current sources and each of said D/A converter circuit are integrated as an IC and said output pins of the one horizontal scan line are assigned to said ICs.

12. An organic EL display device comprising an organic EL element drive circuit as claimed in claim 1.

* * * * *